United States Patent [19]

Neidig et al.

[11] Patent Number: 4,727,455
[45] Date of Patent: Feb. 23, 1988

[54] SEMICONDUCTOR POWER MODULE WITH AN INTEGRATED HEAT PIPE

[75] Inventors: Arno Neidig, Plankstadt; Hans G. Wessjohann, Mannheim, both of Fed. Rep. of Germany

[73] Assignee: Brown, Boveri & Cie AG, Mannheim-Käfertal, Fed. Rep. of Germany

[21] Appl. No.: 830,065

[22] Filed: Feb. 14, 1986

[30] Foreign Application Priority Data

Feb. 14, 1985 [DE] Fed. Rep. of Germany ....... 3504992

[51] Int. Cl.$^4$ ..................... H05K 7/20; F28D 15/02
[52] U.S. Cl. .................... 361/385; 361/388; 357/82; 174/15 HP; 165/104.33
[58] Field of Search ............. 174/15 R, 15 HP; 165/104.33; 357/82; 361/380, 381, 382, 385, 388, 389

[56] References Cited

U.S. PATENT DOCUMENTS

| | | | |
|---|---|---|---|
| 4,212,349 | 7/1980 | Andros et al. | 174/15 HP X |
| 4,327,399 | 4/1982 | Sasaki et al. | 361/385 |
| 4,551,787 | 11/1985 | Mittal et al. | 361/387 |

*Primary Examiner*—J. R. Scott
*Assistant Examiner*—H. L. Williams
*Attorney, Agent, or Firm*—Herbert L. Lerner; Laurence A. Greenberg

[57] ABSTRACT

A semiconductor power module includes a metallized ceramic carrier plate having an opening formed therein, a semiconductor power component with a base area of a given size adjacent the ceramic plate at the opening, a heat pipe integrated in the semiconductor power module having a vapor space, a condensation zone and a heating zone for distributing heat removed from the semiconductor power component at the heating zone over an area of the condensation zone being larger than the given area, a highly heat-conducting ceramic base plate having two metallized sides, and a frame vacuum-tightly interconnecting the carrier plate and the base plate forming the vapor space of the heat pipe therebetween.

14 Claims, 3 Drawing Figures

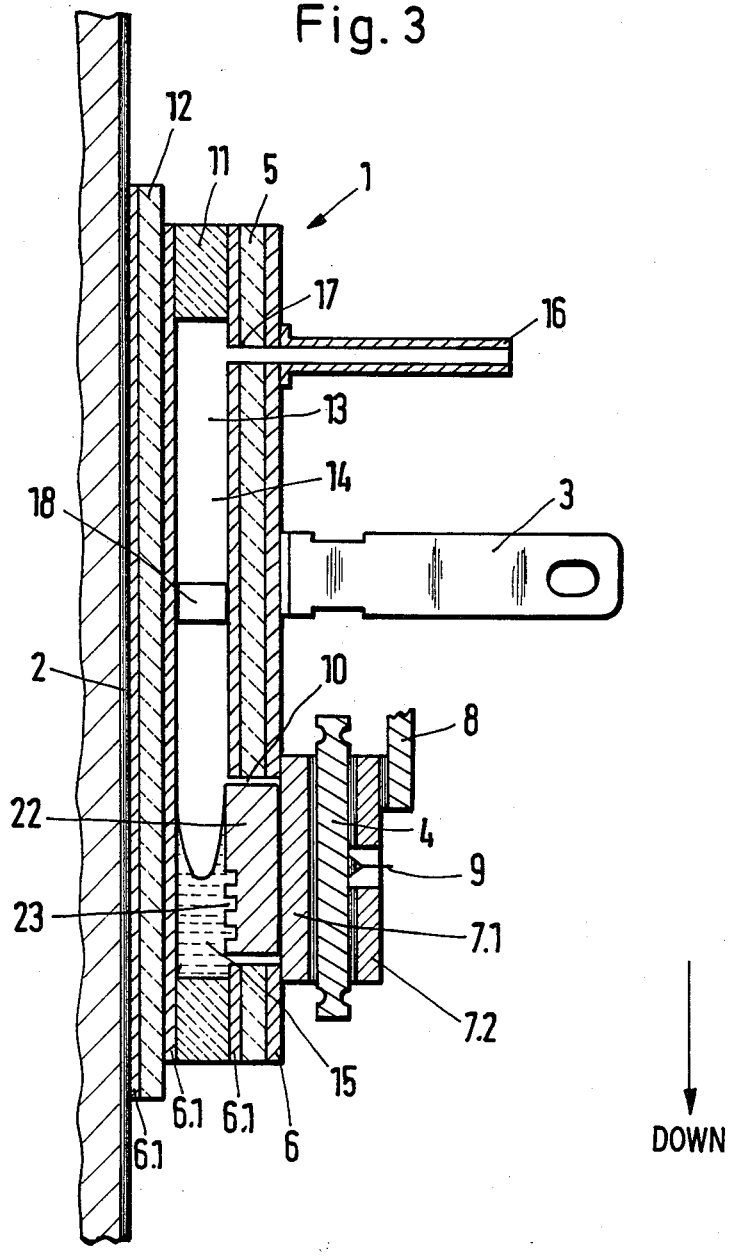

4,727,455

SEMICONDUCTOR POWER MODULE WITH AN INTEGRATED HEAT PIPE

BACKGROUND OF THE INVENTION

1. Field of the Invention

The invention relates to a semiconductor power module with at least one semiconductor power component on a carrier plate formed of metallized ceramic, and at least one heat pipe integrated in the semiconductor power module for distributing heat to be removed from the semiconductor power component over an area of a condensation zone of the heat pipe which is larger than the base area of the semiconductor power component.

2. Description of the Related Art

Such modules have power semiconductors which are assembled by a soldered-contact technique and are electrically insulated on a ceramic substrate serving as the carrier plate.

Such semiconductor power modules are known from German Published, Non-Prosecuted Application DE-OS No. 34 02 003. In that device, the integration of a heat pipe in the module is proposed in order to distribute the dissipation heat of a semiconductor power component over a larger substrate area and therefore to improve the heat transport from the semiconductor power component to a cooling surface (heat sink) through an electrically insulating substrate. All of the structures known from this publication relate to an integration of the heat pipe into the metallization of the substrate. However, Only relatively small vapor spaces are able to be provided there for the heat pipe, so that the heat transport performance is strictly limited. In addition, the fabrication of the proposed fine structures for capillaries and vapor spaces is not very simple.

British Pat. No. 20 39 416 discloses a semiconductor power module with a heat pipe which has a vapor space of sufficient size. In FIG. 2 of that patent, a construction is shown in which a ceramic substrate is provided with cavities and is formed as a heat pipe. However, in that case the heat transport must go from the semiconductor components into the vapor space through a ceramic layer. Better thermal coupling between the semiconductor components and the vapor space of a heat pipe is obtained in a construction according to FIG. 5. In this construction, holes are provided in the ceramic, into which the semiconductor components are inserted and which are therefore in direct contact with the vapor space of the heat pipe. However, this concept still has some shortcomings, especially with respect to the practical ability to produce a module with a sufficiently long life. For instance, with the given means for joining the semiconductor components to the substrate and with the working liquids mentioned, no material combination is possible which would not lead to corrosion after a short time. In addition, a good spreading of the heat is not provided by the heat transport to one end of the heat pipe.

SUMMARY OF THE INVENTION

It is accordingly an object of the invention to provide a semiconductor power module with an integrated heat pipe, which overcomes the hereinafore-mentioned disadvantages of the heretofore-known devices of this general type, which permits a large vapor space of the heat pipe to be provided, which is easy to produce and which is improved with respect to corrosion in the heat pipe.

With the foregoing and other objects in view there is provided, in accordance with the invention, a semiconductor power module, comprising a metallized ceramic carrier plate having an opening formed therein, at least one semiconductor power component with a base area of a given size on the ceramic plate at the opening, at least one heat pipe integrated in the semiconductor power module having a vapor space, a condensation zone and a heating zone for distributing heat removed from the semiconductor power component at the heating zone over an area of the condensation zone being larger than the given area, a highly heat-conducting ceramic base plate having two metallized sides, and a frame vacuum-tightly interconnecting the carrier plate and the base plate forming the vapor space of the heat pipe therebetween.

In accordance with another feature of the invention, there is provided a compensation disc disposed between the carrier plate and the semiconductor power component.

The advantages of the invention are, among others, that the semiconductor module with an integrated heat pipe can be fabricated in a simple manner by an assembly of commercially available parts, namely ceramic substrates, and that the module can be handled in a manner similar to modules without heat pipes. All of the parts of the heat pipe which come into contact with the working liquid can be made of ceramic or copper or can be coated with copper, so that no corrosion problems need be expected.

In accordance with a further feature of the invention, there is provided a working liquid in the heating pipe and a capillary structure in the heat pipe transporting the working liquid back to the heating zone at or below the semiconductor component from the condesnation zone. In this way, the module can be operated in any installation position.

In accordance with an added feature of the invention, there are provided bracing elements disposed between the carrier plate and the base plate.

The required vacuum-tight connection between ceramic and copper parts or between copper surfaces can be made by so-called direct bonding. In accordance with an additional feature of the invention, the base plate frame, carrier plate and compensation disc are interconnected by direct bonding forming walls of the heat pipe.

In accordance with again another feature of the invention, all parts of the heat pipe contacting the working liquid are formed of a material from the group consisting of ceramic, copper and copper-coated material.

In accordance with again a further feature of the invention, the base plate is formed of ceramic with a purity of at least 96% $Al_2O_3$ and preferably 99.5% $Al_2O_3$.

In accordance with again an added feature of the invention, there is provided a heat distributing element formed of highly heat-conducting material disposed in the heating zone of the heat pipe. This is done for better heat distribution.

In accordance with again an additional feature of the invention, the heat distributing element has a side facing the vapor space with a fin structure formed therein.

In accordance with yet another feature of the invention, the heat distributing element is formed of copper.

In accordance with yet a further feature of the invention, the heat distrubuting element is soldered to the compensation disc.

In accordance with yet an added feature of the invention, the heat distributing element and the compensation disc are integral with each other in one structural part formed of a material matched to the semiconductor power component with respect to thermal coefficient of expansion.

In accordance with a concomitant feature of the invention, there is provided a cooling body or heat sink connected to the base plate.

Other features which are considered as characteristic for the invention are set forth in the appended claims.

Although the invention is illustrated and described herein as embodied in a semiconductor power module with an integrated heat pipe, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings in which:

BRIEF DESCRIPTION OF THE DRAWING

FIG. 3 is another fragmentary, cross-sectional view of a semiconductor power module with a heat pipe having a special heat distributing element in the heating zone.

Heat pipes are generally known and are described, for instance, in the Publication BBC Nachrichten, 1966, pages 206 to 211. Such a structure involves a closed space which is partially filled with a liquid. The material used for the wall and the type of liquid depend essentially on the temperature range in which the heat pipe is to operate. Upon supplying heat at one point of the heat pipe in a so-called heating zone, the liquid evaporates and the vapor is distributed over the entire interior. The vapor is condensed at a heat sink and gives off heat in the process. The working liquid must be transported back to the heating zone. This can be done by gravity if the heat pipe is disposed in such a way that the heating zone is located at the bottom and the heat sink is further up. However, the liquid can also be transported back by capillary force, for which purpose the inner wall is provided with grooves, screens or a porous layer. The heat pipe is distinguished by the fact that the heat can be transported from a heat source to a heat sink which is farther removed and/or has a large area, after only a small temperature drop. The chamber formed by the so-called heat pipe need by no means be cylindrical. On the contrary, a heat pipe can have almost any desired shape.

Semiconductor power modules are frequently operated in a defined installation position, such as on a vertical wall in a switch box or control panel. In such cases, a semiconductor power module with a gravity pipe can be employed as is shown in FIG. 1.

DESCRIPTION OF THE PREFERRED EMBODIMENTS

Figure 1:
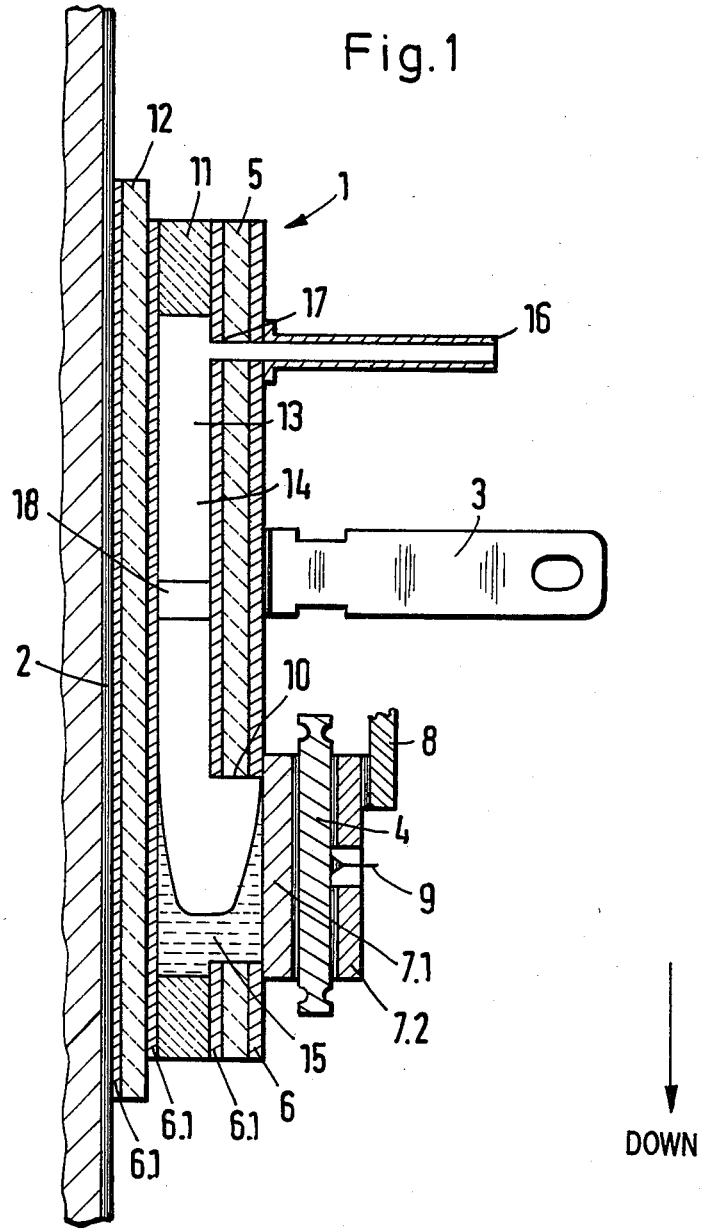
FIG. 1 is a fragmentary, diagrammatic, cross-sectional view of a semiconductor power module with a heat pipe without a capillary structure (a gravity heat pipe)

Referring now to the figures of the drawings and first, particularly, to FIG. 1 thereof, there is seen a semiconductor power module 1 which is normally provided with a non-illustrated plastic housing and is mounted on a cooling body 2 serving as a heat sink. Terminals 3, semiconductor power components 4 and other non-illustrated components are optionally mounted on a carrier plate 5. The carrier plate 5 is a metallized ceramic plate. The carrier plate 5 need not have a particularly high heat conductivity and can therefore be made preferably of $Al_2O_3$ ceramic with a low purity (for instance with an $Al_2O_3$ content of less than 96%), which is 1 to 2 mm thick. The upper surface of the carrier plate 5 (as seen when the module 1 is built in) facing the assembly elements 3, 4 has a metallization 6 of copper structured in accordance with the desired circuit, which may have a layer thickness of 0.3 to 0.5 mm. Since the carrier plate 5 need not have particularly high heat conductivity, it may be formed of a relatively thick ceramic plate which may also support a relatively thick copper layer, namely, the structured metallization 6. With large currents, this can be particularly advantageous, since the structured metallization 6 on the upper surface of the carrier plate 5 forms the conductor runs of a switching network.

Semiconductor power components 4 are not soldered directly to the metallization 6 of the carrier plate 5, but are provided in the usual manner with molybdenum discs 7.1, 7.2 serving as spacer and equalization discs. The upper equalization disc 7.2 carries a cathode terminal 8 and has a hole formed therein in the vicinity of a gate terminal 9. The lower equalization disc 7.1 covers an opening 10 in the carrier plate 5.

One or more such openings 10 are formed in the vicinity of the lower edge of the carrier plate 5, (as seen in the built-in state of the module 1). Depending on the shape of the semiconductor power components 4 or the equalization discs 7.1, the shape of the opening may be round or rectangular. For instance, the opening 10 may be made 1 mm smaller than the equalization disc 7.1. The carrier plate 5 is connected to a base plate 12 by a frame 11. The thickness of the frame 11 between the carrier plate 5 and the base plate 12 depends on the layout of a vapor space 13 of a heat pipe 14. The thicker the frame 11, the larger the vapor space 13 and therefore the heat transport performance of the heat pipe 14. As tests have shown, a module having a base plate 12 with an area 70×100 mm and a frame 11 with a thickness of 1 to 2 mm is sufficient to distribute dissipation losses of several hundred watts uniformly over the heat pipe 14. The frame 11 may be formed of the same low-purity ceramic material as the carrier plate 5. However, the frame 11 can also be formed of metal with a suitable thermal expansion, such as a copper sheet which is about 1 mm thick and has enough spring to intercept the differences in thermal expansion but is strong enough to brace against external pressure.

The base plate must have good thermal conductivity and must insulate electrically. The base plate is formed of high-purity $Al_2O_3$ ceramic (at least 96% $Al_2O_3$, for instance 99.5% $Al_2O_3$) and is typically 0.64 mm thick. The base plate is provided on both sides with a metallization 6.1 in the form of sheet copper which is about 0.2 to 0.3 mm thick. On the side facing away from the cooling body 2, the metallization 6.1 is set back about 1 to 2 mm from the edge of the base plate 12 in order to assure a sufficient insulation path to the electrical insulation.

All of the connections between the metallizations 6, 6.1 and the ceramic plates 5, 12 as well as the connections of the plates 5, 12 to the frame 11 and to each other are advantageously made by direct bonding. To this end, a metallization 6.1 must also be provided between the frame 11 and the carrier plate 5, which must be located on the carrier plate 5 or on the frame 11. The carrier plate 5 as well as the frame 11 may also be metallized on both sides since two metallizations 6.1 can easily be joined together. It may be advantageous to provide a metallization over the entire lower surface of the carrier plate 5. This depends on whether or not the entire assembly of the plates 5 and 12 and the frame 11 is arched after completion as a consequence of mechanical stresses. Advantageously, a slightly convex arching toward the cooling body 2 of the base plate 12 is provided. This arching can also be influenced by the thickness of the metallizations 6.1 on the base plate 12. The direct bodning method mentioned above is generally known and is described, for instance, in German Patent DE-PS No. 30 36 128.

As already mentioned, the vapor space 13 required for the heat pipe 14 is formed by the plates 5 and 12, the frame 11 and the lower compensation or equalization discs 7.1 under the semiconductor power components 4. The connections between these parts must be vacuum tight. Some working liquid 15 (for instance, water) is required to complete the heat pipe 14, which is filled in through a copper filling tube 16 which is put in place in the carrier plate 5 through a hole 17 and is directly connected to the structured metallization 6 of the plate 5 by direct bonding.

In the assembly position, the working liquid 15 collects in the vicinity of the lower equalization disc 7.1 under the action of gravity and wets the disc 7.1 due to the degree of filling or by adhesion and the capillary effect, as indicated in FIG. 1. Due to the dissipation heat of the semiconductor power component 4, which is transmitted to the working liquid through the lower equalization disc 7.1, the liquid evaporates. The vapor spreads through the entire vapor space, is condensed at the cooled base plate 12 (condensation region) and flows back to the heating zone.

Further details regarding the semiconductor power module according to the invention will be seen from the following description of a possible method of manufacturing the module.

The carrier plate 5 (with the holes 10, 17) and the base plate 12 are first coated with copper on both sides in order to provide the metallizations 6.1 and the structured metallization 6 on the upper surface of the plate 5. After the metallizations 6 and 6.1 on the upper surface of the plates 5 and 12, respectively, are shaped appropriately, the lower compensation discs 7.1 are coated with copper in preparation for a joining process, in which the lower compensation discs 7.1 and the filling tube 16 are put in place by direct bonding on the upper surface of the carrier plate 5. This is considered to be more advantageous than assembling these parts by soft soldering, because corrosion problems could be caused by the working liquid 15 (deionized water), if these parts are soft-soldered.

Subsequently, the base plate 12, the frame 11 and the preassembled carrier plate 5 are stacked in preparation for the next joining process. In order to increase stability, especially in view of the later evacuated condition, spacers or bracing elements 18 formed of a suitable material can be inserted into the space between the carrier plate 5 and the base plate 12. These spacers 18 can be formed on the frame 11, for instance. This is followed by direct bonding and the outer copper surfaces are subsequently nickel-plated currentlessly or electrolessly (chemically), in preparation for the following soft-soldering processes, in which the structure with the integrated heat pipe 14 is treated like a customary metallized ceramic substrate. This means that the semiconductor power components 4, the upper compensation discs 7.2, the terminals 3, 8 and other parts are soldered on and a plastic encapsulation is performed. Some working liquid 15, for instance water, is filled into the heat pipe through the filling tube 16, the vapor space 13 is evacuated to about 2000 to 3000 Pa and the filling tube 16 is squeezed-off, vacuum-tight. With such a module 1 according to the invention with a semiconductor power component (thyristor) and with a 25 mm diameter of the anode contact area and an opening 10 with a diameter of 21 mm in the carrier plate 5, a d-c resistance between the active part (junction) of the semiconductor power component 4 and the cooling body 2 of $R_{thJK}=0.06$ K/W is obtained. This value corresponds approximately to a corresponding disc cell cooled on both sides with insulated construction. In order to gauge the advance which is achieved, the above-mentioned heat resistance value should be compared with a heat resistance of about 0.15 K/W for the same component with an insulated construction (ceramic plate 0.64 mm thick formed of $Al_2O_3$ with a purity of 99.5%) but without an integrated heat pipe.

Figure 2:
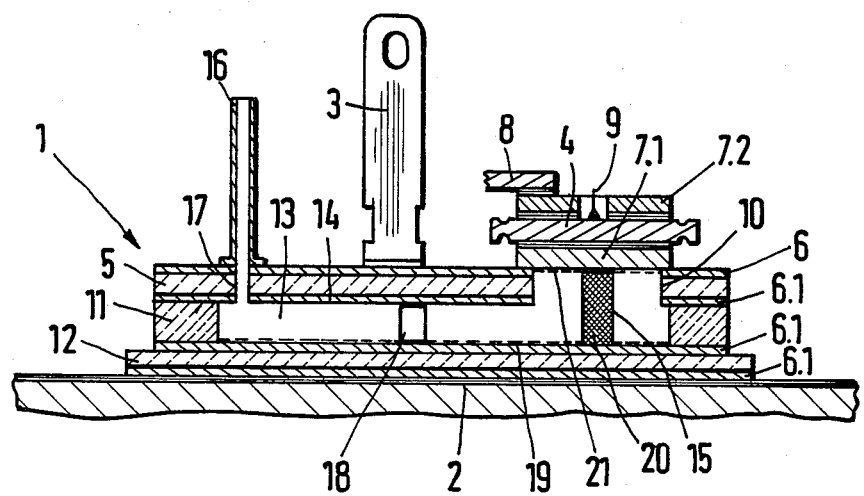
FIG. 2 is a fragmentary, cross-sectional view of a semiconductor power module with a heat pipe which contains a capillary structure.

FIG. 2 shows an embodiment of the semiconductor power module 1 according to the invention in which the assembly position can be arbitrarily chosen and which is therefore independent of gravity. This is achieved by a capillary structure 19, 20, 21, by means of which the condensed working liquid 15 is transported by capillary forces back to the heating zone, i.e., to the lower compensation disc 7.1.

In order to fabricate the capillary structure 19, 20, 21, a fine mesh screen 19 formed of copper wire is placed on the side of the base plate 12 facing away from the cooling body 2 before the carrier plate 5, the frame 11 and the base plate 12 are assembled. In addition, a porous sintered pressed part 20 formed of copper or ceramic with a diameter of about 5 mm is inserted centrally below the lower compensation disc 7.1 and maintains a distance from the base plate 12 to the compensation disc 7.1 of corresponding height. These parts 19, 20 are fastened by direct bonding. In turn, the side of the lower compensation disc 7.1 facing the interior of the heat pipe 14 has a capillary system 21 which extends just to the edge of the opening 10 in the carrier plate 5.

Naturally, a multiplicity of further possibilities are available for providing a capillary structure, which need not be listed here. For instance, grooves in the metallization 6.1 may be provided instead of the copper wire screens 19.

Due to inhomogeneous current distribution within the semiconductor power component 4 (so-called skewed load), an uneven heat production in the semiconductor power component 4 can occur. In such a case the temperature distribution at the transition surface from the lower compensation disc 7.1, which is commonly formed of molybdenum, to the working liquid 15 is inhomogeneous, because the thermal conductivity of molybdenum is insufficient to distribute the heat flow from the semiconductor power component 4 over the entire area of the compensation disc 7.1. So-called hot spots can therefore occur in the heating zone which cause the occurrence of so-called film boiling. These hot spots dry out and are overheated further while the boiling temperature for bubble boiling which is desirable for good heat removal is not reached at the cooler spots. This process reduces the effective heating zone.

A remedy can be provided according to an advantageous embodiment shown in FIG. 3, by providing a special heat distributing element 22 which is disposed in the heating zone. The heat distributing element 22 is formed of a highly heat-conducting material such as copper and distributes the heat produced in the semiconductor power component 4 by spreading the heat over a large area.

In the illustrated embodiment of the heat pipe 14, the proposed heat distributing element 22 is particularly effective without a capillary structure but can be used in principle even if a heat pipe 14 with a capillary structure 19 is used.

Additionally, the applicability of the proposed heat distributing element 22 is not limited to the special construction of the module proposed by the present invention. The heat distributing element 22 can be provided in an semiconductor power module with an integrated heat pipe 14, in which a semiconductor power component 4 is in connection with the vapor space 13 of the heat pipe 14, directly or through intermediate layers.

The heat distributing element 22 can be soldered to the lower compensation disc 7.1. If a material is chosen for the heat distributing element 22 which is matched to the semiconductor power component 4, i.e., to silicon with respect to the thermal coefficient of expansion, an integrated part can advantageously be provided as the compensation disc and the heat distributing element, such as a part made of a sintered metal such as copper-molybdenum which itself can be connected to the copper layer 6 in a vacuum-tight manner.

In order to enlarge the contact area between the heat distributing element 22 and the working liquid 15, the heat distributing element 22 can be provided with a fin structure 23, which may be grooves on the side facing the vapor space 13.

The foregoing is a description corresponding in substance to German Application Patent No. 35 04 992.8, filed Feb. 14, 1985, the International priority of which is being claimed for the instant application and which is hereby made part of this application. Any material discrepancies between the foregoing specification and the aforementioned corresponding German application are to be resolved in favor of the latter.

What is claimed is:

1. Semiconductor power module, comprising a metallized ceramic carrier plate having an opening formed therein, a semiconductor power component with a base area of a given size adjacent said ceramic plate at said opening, a heat pipe integrated in the semiconductor power module having a vapor space, a condensation zone and a heating zone for distributing heat removed from said semiconductor power component at said heating zone over an area of said condensation zone being larger than said given size, a highly heat-conducting ceramic base plate having two metallized sides, a frame sealingly interconnecting said carrier plate and said base plate forming said vapor space of said heat pipe therebetween, and a working liquid in said heat pipe, all parts of said heat pipe contacting said working liquid being formed of a material from the group consisting of ceramic, copper and copper-coated material.

2. Semiconductor power module according to claim 1, including a compensation disc disposed between said carrier plate and said semiconductor power component.

3. Semiconductor power module according to claim 1, including a capillary structure in said heat pipe transporting said working liquid back to said heating zone at said semiconductor power component from said condensation zone.

4. Semiconductor power module according to claim 1, including bracing elements disposed between said carrier plate and said base plate.

5. Semiconductor power module according to claim 2, wherein said base plate, frame, carrier plate and compensation disc are interconnected by direct bonding forming walls of said heat pipe.

6. Semiconductor power module according to claim 1, wherein said base plate is formed of ceramic with a purity of at least 96% $Al_2O_3$.

7. Semiconductor power module according to claim 1, wherein said base plate is formed of ceramic with a purity of 99.5% $Al_2O_3$.

8. Semiconductor power module according to claim 1, including a heat distributing element formed of highly heat-conducting material disposed in said heating zone of said heat pipe.

9. Semiconductor power module according to claim 2, including a heat distributing element formed of highly heat-conducting material disposed in said heating zone of said heat pipe.

10. Semiconductor power module according to claim 9, wherein said heat distributing element has a side facing said vapor space with a fin structure formed therein.

11. Semiconductor power module according to claim 8, wherein said heat distributing element is formed of copper.

12. Semiconductor power module according to claim 9, wherein said heat distributing element is soldered to said compensation disc.

13. Semiconductor power module according to claim 9, wherein said heat distributing element and said compensation disc are integral with each other in one structural part formed of a material matched to said semiconductor power component with respect to thermal coefficient of expansion.

14. Semiconductor power module according to claim 1, including a cooling body connected to said base plate.

* * * * *